(12) United States Patent
Pinna et al.

(10) Patent No.: US 11,821,731 B2
(45) Date of Patent: Nov. 21, 2023

(54) MINIMIZING A DELAY OF A CAPACITANCE-TO-VOLTAGE CONVERTER OF A GYROSCOPE BY INCLUDING SUCH CONVERTER WITHIN A BANDPASS SIGMA-DELTA ANALOG-TO-DIGITAL CONVERTER OF THE GYROSCOPE

(71) Applicant: INVENSENSE, INC., San Jose, CA (US)

(72) Inventors: Carlo Pinna, Milan (IT); Sriraman Dakshinamurthy, San Jose, CA (US)

(73) Assignee: INVENSENSE, INC., San Jose, CA (US)

(*) Notice: Subject to any disclaimer, the term of this patent is extended or adjusted under 35 U.S.C. 154(b) by 267 days.

(21) Appl. No.: 17/400,102

(22) Filed: Aug. 11, 2021

(65) Prior Publication Data
US 2022/0057207 A1    Feb. 24, 2022

Related U.S. Application Data

(60) Provisional application No. 63/067,602, filed on Aug. 19, 2020.

(51) Int. Cl.
*H03M 3/00* (2006.01)
*G01C 19/5712* (2012.01)

(52) U.S. Cl.
CPC ........ *G01C 19/5712* (2013.01); *H03M 3/358* (2013.01); *H03M 3/402* (2013.01); *H03M 3/458* (2013.01)

(58) Field of Classification Search
CPC ............ G01C 19/5712; G01C 19/5614; G01C 19/5621; H03M 3/358; H03M 3/402; H03M 3/458; H03M 3/454
See application file for complete search history.

(56) References Cited

U.S. PATENT DOCUMENTS

| | | | |
|---|---|---|---|
| 6,400,297 B1* | 6/2002 | Tucker ................... | H03M 3/32 341/143 |
| 6,411,242 B1* | 6/2002 | Oprescu ................. | H03M 3/34 341/143 |

(Continued)

OTHER PUBLICATIONS

Petkov, et al. "A Fourth-Order ΣΔ Interface for Micromachined Inertial Sensors" ISSCC 2004 / Session 17 / MEMS and Sensors / 17.6, Feb. 18, 2004, 10 pages.

(Continued)

*Primary Examiner* — David J Bolduc
(74) *Attorney, Agent, or Firm* — Amin, Turocy & Watson, LLP

(57) ABSTRACT

Facilitating minimization of non-linearity effects of a delay of a capacitance-to-voltage (C2V) converter on an output of a gyroscope is presented herein. A sense output signal of a sense mass of the gyroscope and a drive output signal of a drive mass of the gyroscope are electronically coupled to respective analog-to-digital converter (ADC) inputs of bandpass sigma-delta ADCs of the gyroscope. The bandpass sigma-delta ADCs include respective C2V converters that are electronically coupled, via respective feedback loops, to the respective ADC inputs to facilitate reductions of respective propagation delays of the bandpass sigma-delta ADCs. Respective ADC outputs of the bandpass sigma-delta ADCs are electronically coupled to demodulator inputs of a demodulator of the gyroscope that transforms the sense output into an output of the MEMS gyroscope representing an external stimulus that has been applied to the sense mass.

19 Claims, 10 Drawing Sheets

(56) References Cited

U.S. PATENT DOCUMENTS

| | | | |
|---|---|---|---|
| 7,126,516 B2* | 10/2006 | Koc | H03M 3/402 |
| | | | 341/143 |
| 9,535,084 B2* | 1/2017 | Egretzberger | G01C 19/5726 |
| 9,762,259 B1* | 9/2017 | Pu | H03M 3/458 |
| 10,141,948 B2* | 11/2018 | Weng | H03M 3/326 |
| 2007/0164884 A1* | 7/2007 | Ihs | H03M 3/372 |
| | | | 341/143 |
| 2008/0272944 A1* | 11/2008 | Zhou | H03M 3/352 |
| | | | 341/143 |
| 2012/0229317 A1* | 9/2012 | Carlsson | H03M 3/434 |
| | | | 341/200 |
| 2012/0326906 A1* | 12/2012 | Haroun | H03M 3/344 |
| | | | 341/143 |
| 2015/0109157 A1* | 4/2015 | Caldwell | H03M 3/458 |
| | | | 341/143 |
| 2015/0270847 A1* | 9/2015 | Opris | H03M 3/332 |
| | | | 341/143 |
| 2015/0358724 A1* | 12/2015 | Petkov | H04R 3/00 |
| | | | 381/95 |
| 2016/0112795 A1* | 4/2016 | Bach | H03M 3/464 |
| | | | 341/143 |
| 2016/0141327 A1* | 5/2016 | Verdant | H01L 27/14612 |
| | | | 250/208.1 |
| 2016/0308553 A1* | 10/2016 | Mitani | H03M 3/48 |
| 2017/0041019 A1* | 2/2017 | Miglani | H03M 1/0626 |
| 2017/0102248 A1* | 4/2017 | Maurer | G01C 19/5712 |
| 2017/0276484 A1* | 9/2017 | Marx | H03M 3/422 |
| 2017/0328712 A1* | 11/2017 | Collin | G01C 19/5726 |
| 2018/0310087 A1* | 10/2018 | Buffa | H03M 3/454 |
| 2019/0123762 A1* | 4/2019 | Bach | H04R 3/00 |
| 2020/0116487 A1* | 4/2020 | Ward | G01C 19/5726 |
| 2020/0141989 A1* | 5/2020 | Hargreaves | G06F 3/04182 |
| 2020/0328757 A1* | 10/2020 | Narasimman | G01R 27/2605 |
| 2021/0006260 A1* | 1/2021 | Lee | H03M 3/462 |
| 2021/0293843 A1* | 9/2021 | Valli | H03M 3/458 |

OTHER PUBLICATIONS

Ezekwe, et al. "A Mode-Matching ΔΣ Closed-Loop Vibratory-Gyroscope Readout Interface with a 0.004°/s/√Hz Noise Floor over a 50Hz Band" ISSCC 2008 / Session 32 / MEMS & Sensors / 32.3, Feb. 6, 2008, 3 pages.

* cited by examiner

MINIMIZING A DELAY OF A CAPACITANCE-TO-VOLTAGE CONVERTER OF A GYROSCOPE BY INCLUDING SUCH CONVERTER WITHIN A BANDPASS SIGMA-DELTA ANALOG-TO-DIGITAL CONVERTER OF THE GYROSCOPE

RELATED APPLICATION

This patent application claims priority to U.S. Provisional Patent Application No. 63/067,602, filed on Aug. 19, 2020, and entitled "INTEGRATED C2V WITH ADC FOR MEMS SENSORS," the entirety of which application is hereby incorporated by reference herein.

TECHNICAL FIELD

The subject disclosure generally relates to embodiments for minimizing a delay of a capacitance-to-voltage (C2V) converter of a gyroscope by including such converter within a sigma-delta analog-to-digital converter (ADC) of the gyroscope.

BACKGROUND

Conventional gyroscope technologies utilize separate C2V converters for sensing a drive output and a sense output. In this regard, the drive and sense outputs are input to an analog demodulator, and an output of the analog demodulator is input to an ADC. Due to changes in respective delays of the C2V converters over temperature, corresponding phase shifts of the C2V converters lead to ADC offset non-linearity—the changes in delays representing changes in an offset voltage of the ADC. In this regard, conventional gyroscope technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
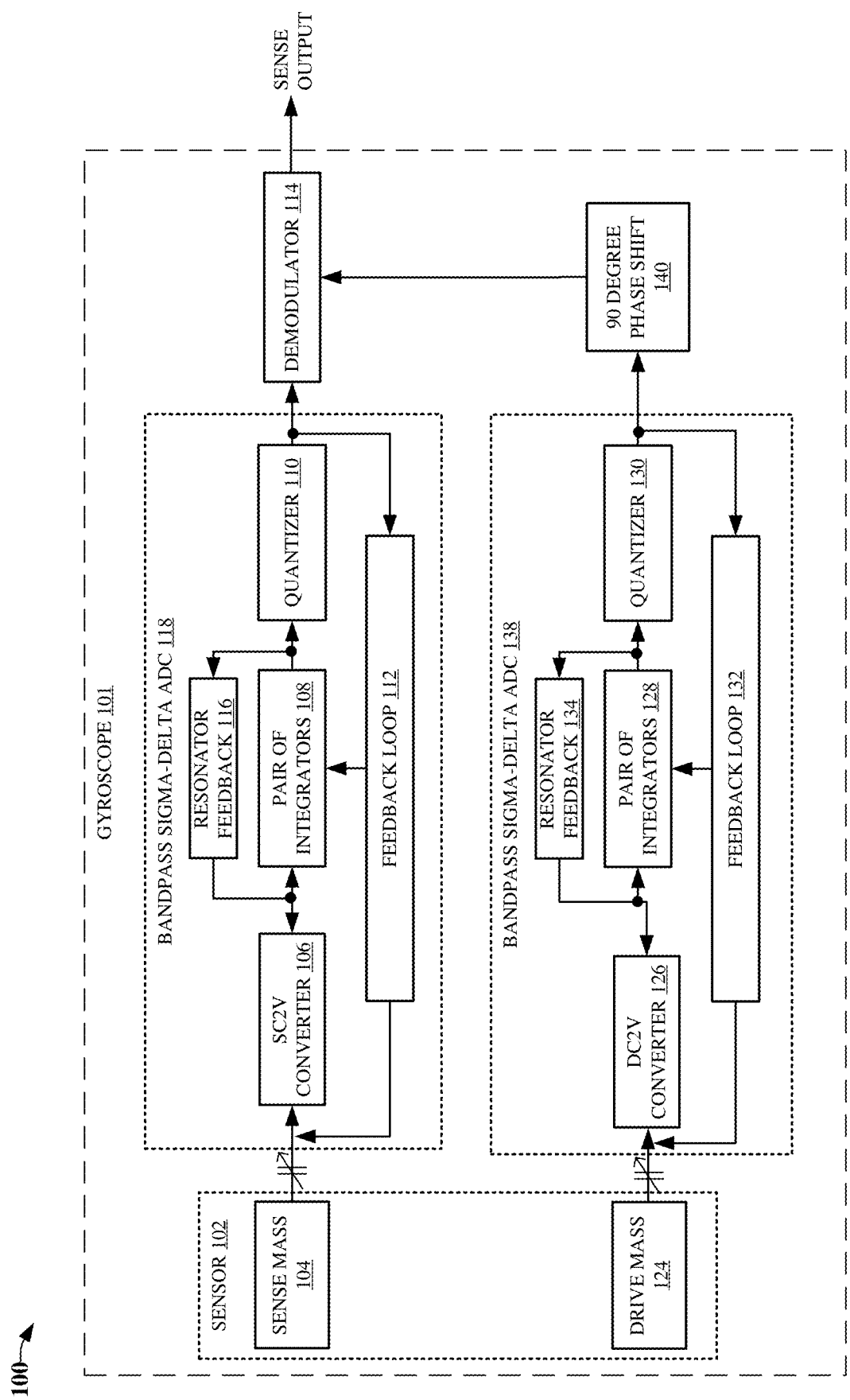
FIG. 1 illustrates a block diagram of a gyroscope that facilitates minimizing non-linearity effects of a delay of a C2V converter on an output of the gyroscope in which each bandpass sigma-delta ADC of the gyroscope includes an analog resonator, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional gyroscope technologies are susceptible to ADC offset non-linearity due to changes in delays of C2V converters over temperature. On the other hand, various embodiments disclosed herein can minimize non-linearity effects of a delay of a C2V converter on an output of a gyroscope by including the C2V converter in a bandpass sigma-delta ADC of the gyroscope.

For example, in embodiment(s), a gyroscope, e.g., a MEMS gyroscope, includes: a sense mass that generates a sense mass output that is electronically coupled to a first ADC input of a first bandpass sigma-delta ADC comprising a sense capacitance-to-voltage converter (SC2VC).

A first ADC output of the first bandpass sigma-delta ADC is electronically coupled, via a first feedback loop, to the first ADC input to facilitate a reduction of an SC2VC delay of the SC2VC corresponding to a first propagation delay of the first bandpass sigma-delta ADC. Further, the first ADC output is electronically coupled to a first demodulator input of a demodulator; and an output of the demodulator represents an output signal of the gyroscope—the demodulator transforming the sense mass output into the output signal of the gyroscope representing the external stimulus.

The gyroscope further includes a drive mass that generates a drive mass output that is electronically coupled to a second ADC input of a second bandpass sigma-delta ADC comprising a drive capacitance-to-voltage converter (DC2VC).

A second ADC output of the second bandpass sigma-delta ADC is electronically coupled, via a second feedback loop, to the second ADC input to facilitate a reduction of a DC2VC delay of the DC2VC corresponding to a second propagation delay of the second bandpass sigma-delta ADC. Further, the second ADC output is electronically coupled to a second demodulator input of the demodulator.

In other embodiment(s), a MEMS gyroscope includes: a MEMS sensor that generates a first output signal that is based on an external stimulus that has been applied to the MEMS sensor, and a second output signal that is based on an internal stimulus that has been applied to the MEMS sensor; and bandpass sigma-delta analog-to-digital converters comprising respective C2V amplifiers.

In this regard, the first output signal of the MEMS sensor is electrically coupled to a first ADC input of a first bandpass sigma-delta ADC of the bandpass sigma-delta analog-to-digital converters—the first bandpass sigma-delta ADC including a first C2V amplifier of the respective C2V amplifiers.

Further, the second output signal of the MEMS sensor is electrically coupled to a second ADC input of a second bandpass sigma-delta ADC of the bandpass sigma-delta analog-to-digital converters—the second bandpass sigma-delta ADC including a second C2V amplifier of the respective C2V amplifiers.

Further, respective outputs of the bandpass sigma-delta ADC converters are electrically coupled, via respective feedback loops, to respective inputs of the first C2V amplifier and the second C2V amplifier to facilitate compressing respective propagation delays of the bandpass sigma-delta ADC converters.

In turn, respective outputs of the bandpass sigma-delta ADC converters are electronically coupled to a demodulator; and an output of the demodulator transforms the first output signal of the MEMS sensor into a sense output of the MEMS gyroscope representing the external stimulus.

In yet other embodiment(s), a MEMS gyroscope includes: a sense mass that generates a sense mass output that is electronically coupled to a ADC input of a first bandpass sigma-delta ADC comprising a sense C2V (SC2VC). In this regard, an SC2VC output of the SC2VC is electrically coupled, via a first pair of quantizers using a first feedback loop, to the first ADC input to facilitate a reduction of an SC2VC delay of the SC2VC corresponding to a first propagation delay of the first bandpass sigma-delta ADC.

In turn, a first quantizer output of a first quantizer, e.g., a successive-approximation-register (SAR) ADC, of the first pair of quantizers is electronically coupled to a first demodulator input of a demodulator; and a demodulator output of the demodulator represents an output signal of the gyroscope.

The MEMS gyroscope further includes a drive mass that generates a drive mass output that is electronically coupled to a second ADC input of a second bandpass sigma-delta ADC comprising a drive capacitance-to-voltage converter (DC2VC). In this regard, a DC2VC output of the DC2VC is electrically coupled, via a second pair of quantizers using a second feedback loop, to the second ADC input to facilitate a reduction of a DC2VC delay of the DC2VC corresponding to a second propagation delay of the second bandpass sigma-delta ADC; and a second quantizer output of a second quantizer, e.g., SAR ADC, of the second pair of quantizers is electronically coupled to a second demodulator input of the demodulator.

As described above, conventional gyroscope technologies have had some drawbacks with respect to incurring ADC offset non-linearity due to changes in phase shifts of a C2V amplifier of a gyroscope over changes in temperature. On the other hand, various embodiments disclosed herein can reduce ADC offset non-linearity of the gyroscope by electrically coupling, via a feedback loop, an output of a bandpass sigma-delta ADC of the gyroscope to an input of the C2V amplifier to facilitate compressing, reducing, etc. a propagation delay of the bandpass sigma-delta ADC converter.

Figure 2:
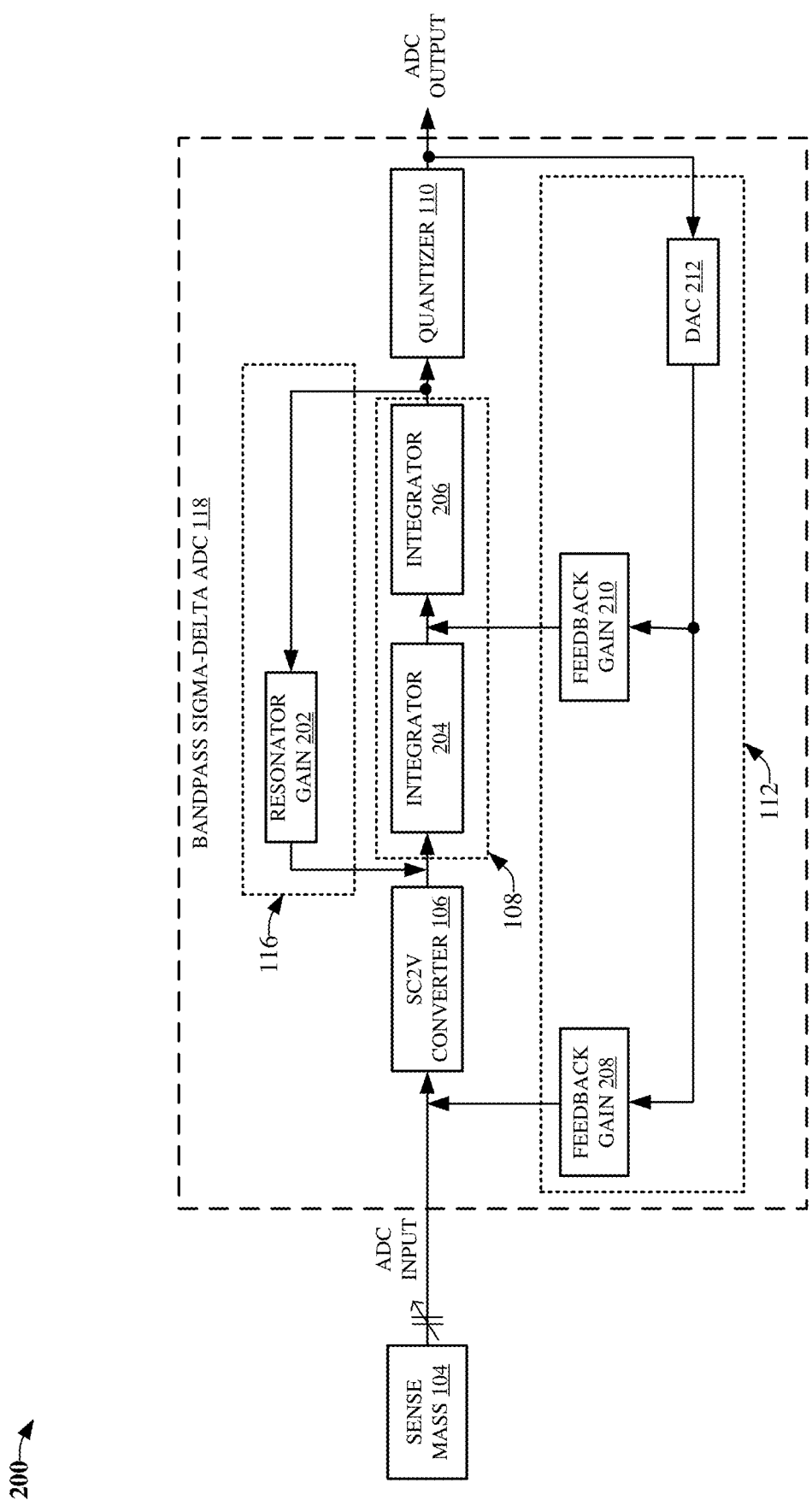
FIG. 2 illustrates a block diagram of a sense mass of a gyroscope electrically coupled to an input of a bandpass sigma-delta ADC of the gyroscope—the bandpass sigma-delta ADC including a C2V converter, in accordance with various example embodiments.
Figure 3:
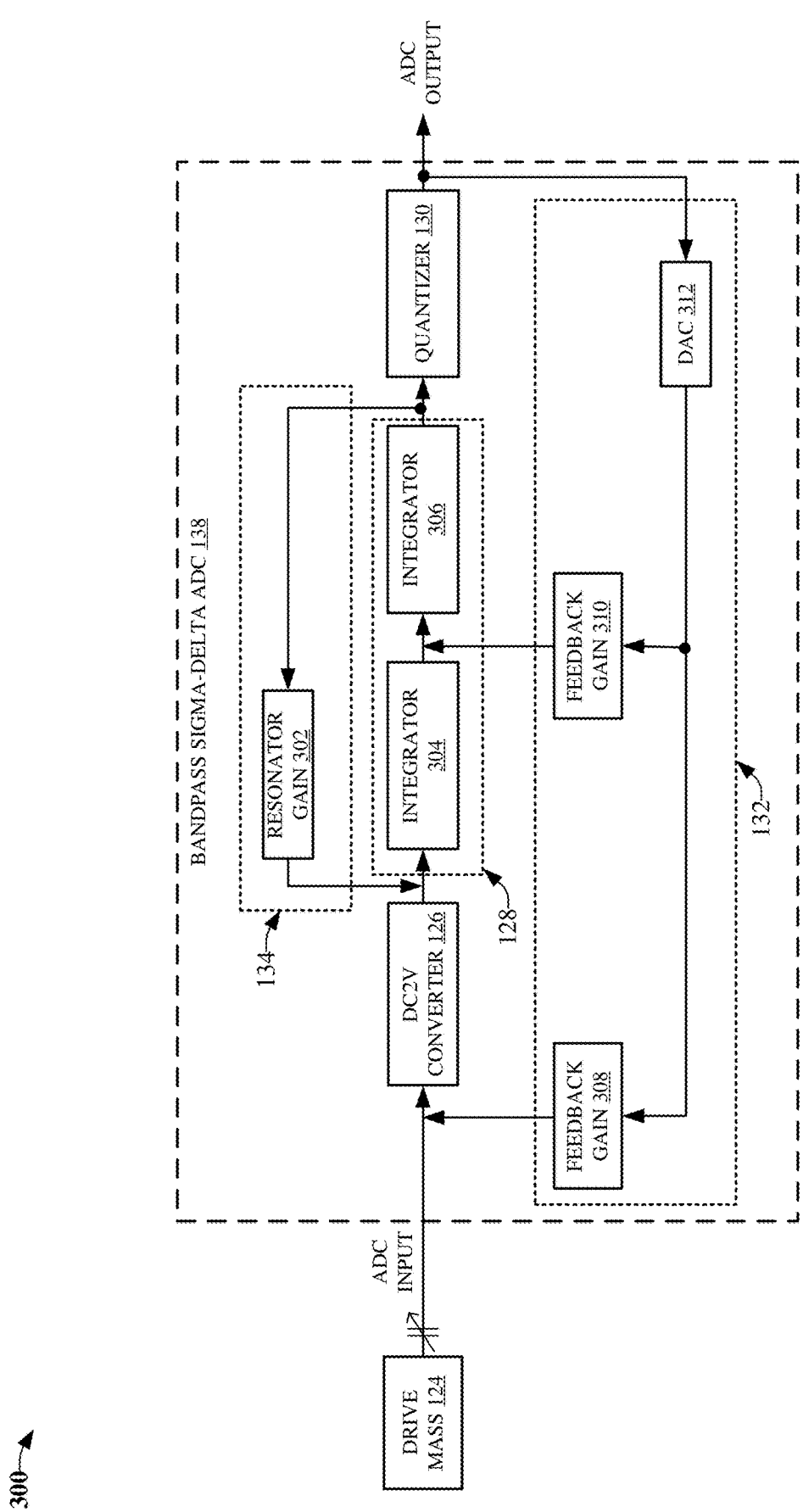
FIG. 3 illustrates a block diagram of a drive mass of a gyroscope electrically coupled to an input of a bandpass sigma-delta ADC of the gyroscope—the bandpass sigma-delta ADC including a C2V converter, in accordance with various example embodiments.

In this regard, and now referring to FIGS. 1-3, block diagrams (100, 200, 300) of a gyroscope (102), e.g., a MEMS gyroscope, that facilitates minimizing non-linearity effects of a delay of a C2V converter, e.g., C2V amplifier, on an output of the gyroscope are illustrated, in accordance with various example embodiments. A sense mass (104) of a sensor (102), e.g., a MEMS sensor, of the gyroscope generates a sense mass output that is based on an external stimulus that has been applied to the sensor—the sense mass output being electronically coupled to an input of a first bandpass sigma-delta ADC (118) that includes an SC2VC (106).

An output of the first bandpass sigma-delta ADC is electronically coupled, via a first feedback loop (112), to the input of the first bandpass sigma-delta ADC to facilitate a reduction, compression, etc. of an SC2VC delay of the SC2VC corresponding to a first propagation delay of the first bandpass sigma-delta ADC. In this regard, by including the SC2VC within the first bandpass sigma-delta ADC—the input of the first bandpass sigma-delta ADC corresponding to the input of SC2VC—a loop gain of the SC2VC is increased to facilitate compression of the first propagation delay.

In turn, the output of the first bandpass sigma-delta ADC is electronically coupled to a first demodulator input of a demodulator (114), in which an output of the demodulator ("SENSE OUTPUT") represents an output signal of the gyroscope—the output of the demodulator transforming the sense mass output into the output signal of the gyroscope representing the external stimulus.

A drive mass (124) of the sensor generates a drive mass output based on an internal stimulus that has been applied, e.g., based on a drive frequency of the internal stimulus, to the sensor—the drive mass output being electronically coupled to an input of a second bandpass sigma-delta ADC (138) that includes a DC2VC (126).

An output of the second bandpass sigma-delta ADC is electronically coupled, via a second feedback loop (132), to the input of the second bandpass sigma-delta ADC to facilitate a reduction, compression, etc. of a DC2VC delay of the DC2VC corresponding to a second propagation delay of the second bandpass sigma-delta ADC.

In this regard, by including the DC2VC within the second bandpass sigma-delta ADC—the input of the second bandpass sigma-delta ADC corresponding to the input of DC2VC—a loop gain of the DC2VC is increased to facilitate compression of the first propagation delay.

In turn, the output of the second bandpass sigma-delta ADC is electronically coupled, e.g., via a 90 degree phase shift (140), to a second demodulator input of the demodulator.

The first bandpass sigma-delta ADC includes a first pair of integrators (108), in which an output of the SC2VC is electronically coupled to an input of a first integrator (204) of the first pair of integrators. An output of the first integrator of the first pair of integrators is electronically coupled to an input of a second integrator (206) of the first pair of integrators. In turn, an output of the second integrator of the first pair of integrators is electrically coupled to the output of the SC2VC, and is electrically coupled to a first quantizer (110), e.g., SAR ADC, that converts the output of the second integrator of the first pair of integrators into the first ADC output.

The second bandpass sigma-delta ADC includes a second pair of integrators (128), in which an output of DC2VC is electronically coupled to an input of a first integrator (304) of the second pair of integrators. An output of the first integrator of the second pair of integrators is electronically coupled to an input of a second integrator (306) of the second pair of integrators. In turn, an output of the second integrator of the second pair of integrators is electrically coupled to the output of the DC2VC, and is electrically coupled to a second quantizer (130), e.g., SAR ADC, that converts the output of the second integrator of the second pair of integrators into the second ADC output.

In embodiment(s), a resonator of the first bandpass signa-delta ADC includes resonator feedback (116) and is formed via the first pair of integrators. In this regard, the first propagation delay can be reduced by increasing a gain of the resonator, e.g., increasing a loop gain of the SC2VC at a resonant frequency of the resonator.

Further, a resonator of the second bandpass signa-delta ADC includes resonator feedback (134) and is formed via the second pair of integrators. In this regard, the second propagation delay can be reduced by increasing a gain of the resonator, e.g., increasing a loop gain of the DC2VC at a resonant frequency of the resonator.

The first propagation delay and the second propagation delay are inherently different because the SC2VC is a different type of circuit design than a circuit design of the DC2VC—the SC2VC being designed to sense movement of the gyroscope, and the DC2VC being designed to sense a mechanical movement of the drive mass. In this regard, the performance of the gyroscope is further reduced in response to an increase of a difference between the first propagation delay and the second propagation delay.

Accordingly, since reducing the first propagation delay and/or the second propagation delay reduces the difference between the first propagation delay and the second propagation delay, the performance of the gyroscope can be increased by increasing respective gains of the resonators corresponding to the first pair of integrators and the second pair of integrators.

In this regard, increasing the loop gain of the SC2VC and the loop gain of the DC2VC facilitates compressing respective propagation delays of the first bandpass sigma-delta ADC and the second bandpass sigma-delta ADC—the compressing of the respective propagation delays facilitating a reduction of a difference between the respective propagation delays, resulting in a reduction of ADC offset non-linearity of the SENSE OUTPUT over temperature.

In other embodiment(s), a gain, or gain factor, of an integrator (e.g., 204, etc.) can be derived from a resistance-capacitance (RC) product corresponding to charging/discharging of an RC circuit (not shown) of the integrator. In this regard, in response changes in a resistance of the RC circuit occurring as a result of changes in temperature of the gyroscope, a voltage being supplied to the RC circuit can be modified to counteract changes in the resistance, and thus counteract changes to a gain factor corresponding to the integrator, which are due to the changes in temperature—enabling modification of the first propagation delay and/or the second propagation delay to reduce the difference between the first propagation delay and the second propagation delay.

In addition, by matching respective gain factors of the first pair of integrators and the second pair of integrators, the difference between the first propagation delay and the second propagation delay can be reduced since such gain factors have a greater effect on the first propagation delay and the second propagation delay.

In embodiment(s), respective digital-to-analog converters (DACs) (212, 312) of the first and second feedback loops convert digital values representing the first and second ADC outputs into respective analog signals that are electronically coupled to respective gains, or feedback gains (208, 210, 308, 310) of the first and second feedback loops to facilitate modification of respective feedback loop gains of the first and second feedback loops, e.g., to facilitate reducing the first and second propagation delays.

Figure 4:
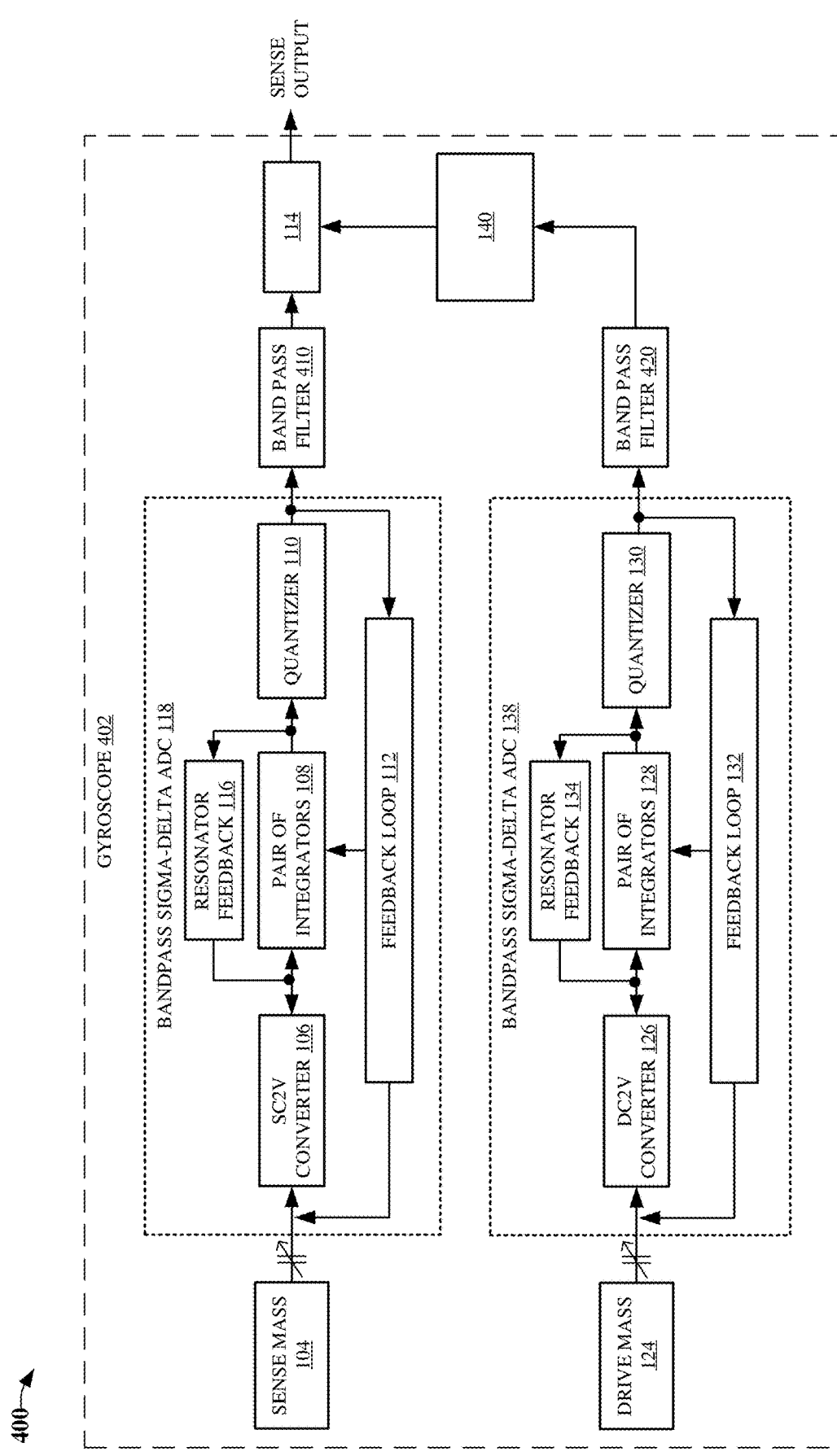
FIGS. 4-5 illustrate block diagrams of a gyroscope that facilitates minimizing non-linearity effects of a delay of a C2V converter on an output of the gyroscope in which each bandpass sigma-delta ADC of the gyroscope includes an analog resonator, and the gyroscope includes band pass filters at respective outputs of the bandpass sigma-delta ADCs, in accordance with various example embodiments.
Figure 5:
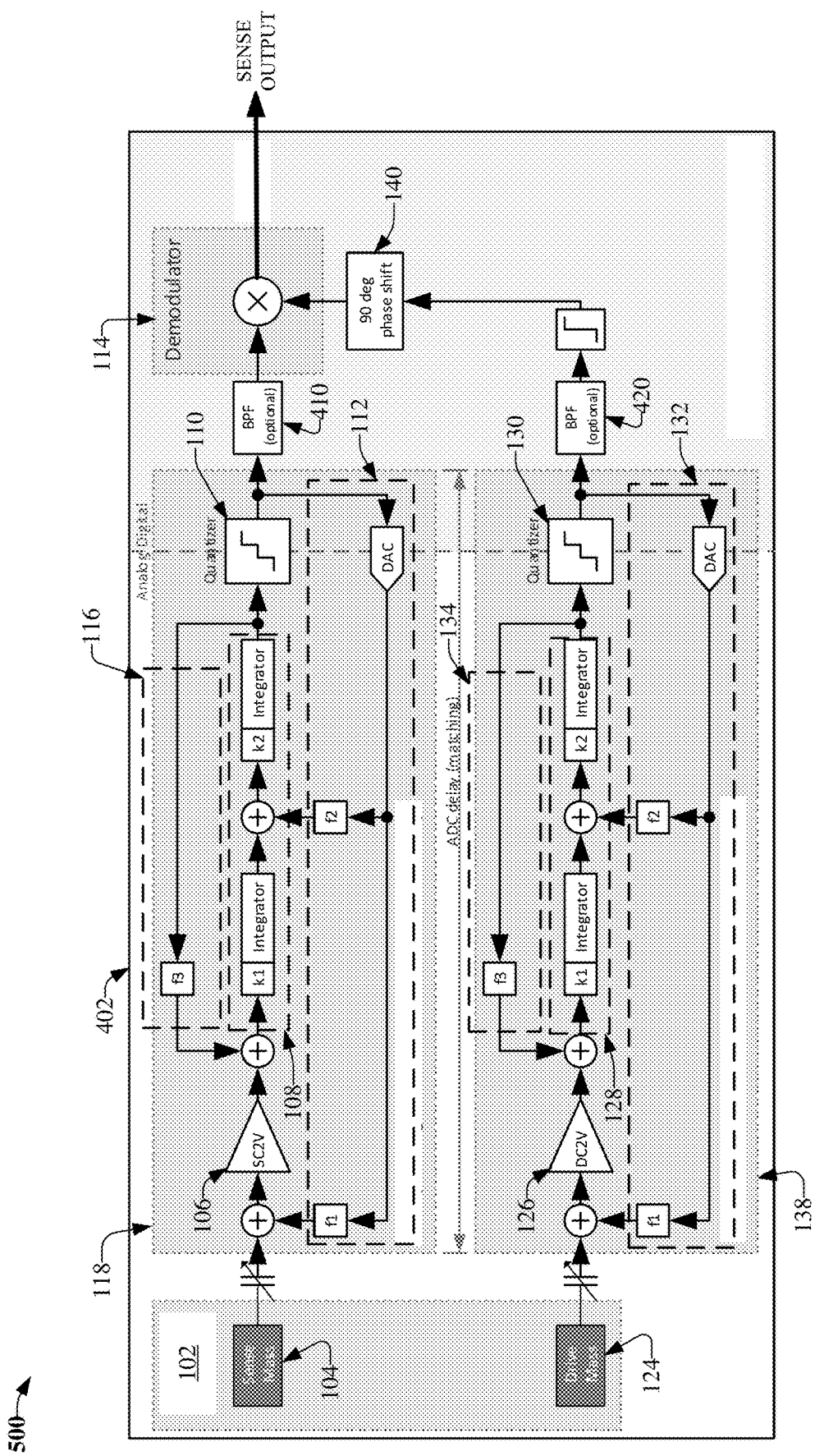

FIGS. 4-5 illustrate block diagrams of a gyroscope including respective bandpass filters that facilitate reducing a defined amount of noise that is present on the first and second ADC outputs, e.g., corresponding to harmonics, noise, or other similar signals that are outside of a defined frequency band of interest of the SENSE OUTPUT signal—such signals not representing the external stimulus that has been applied to the sensor.

In embodiment(s) illustrated by FIGS. 6-10, block diagrams (600, 700, 800, 900, 1000) of a MEMS gyroscope (601, 902) that facilitates minimizing non-linearity effects of respective delays of C2V converters on an output of the MEMS gyroscope—each bandpass sigma-delta ADC of the MEMS gyroscope including a C2V converter, an analog resonator, and a digital resonator—are illustrated, in accordance with various example embodiments.

Figure 6:
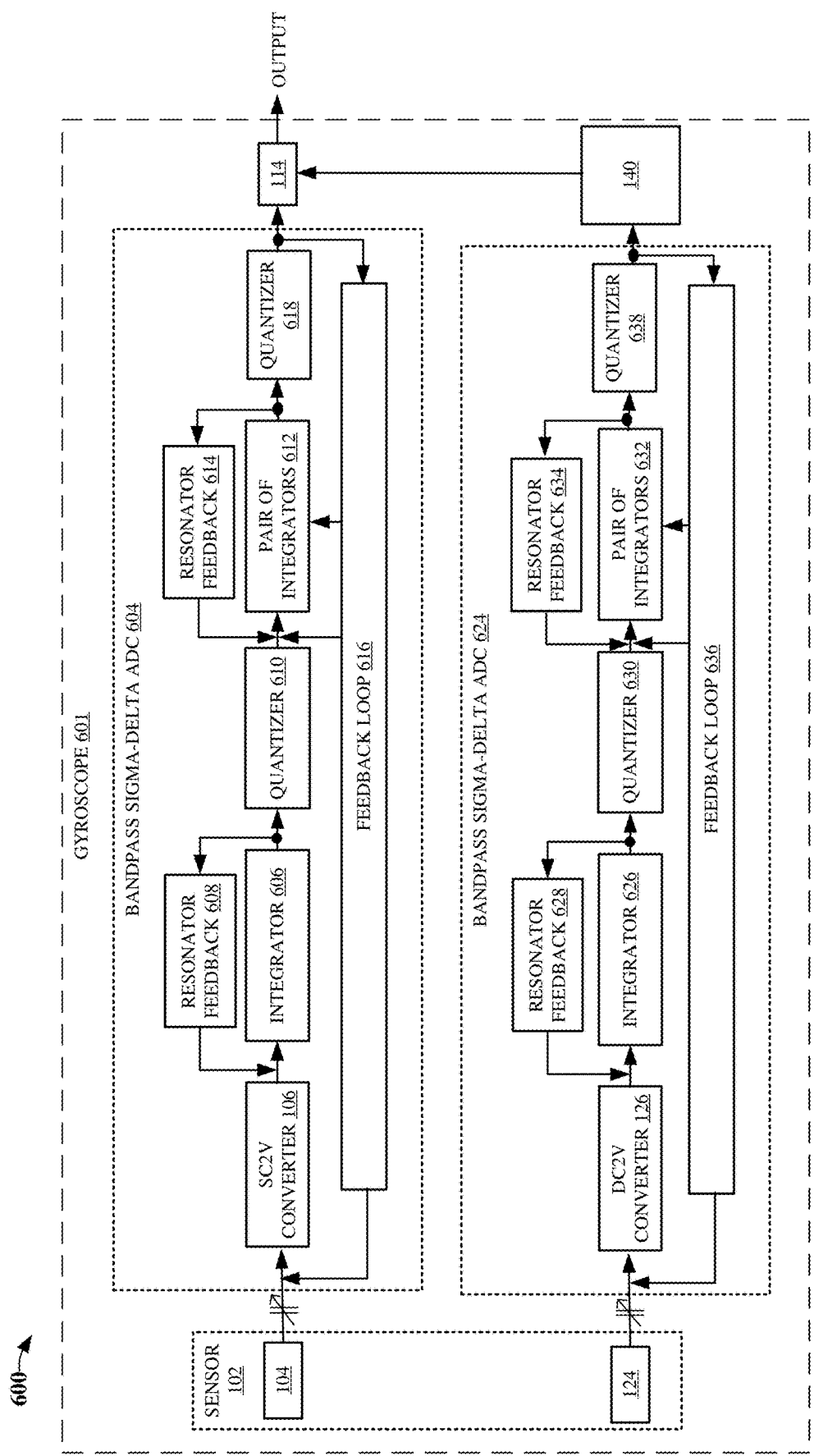
FIG. 6 illustrates a block diagram of a micro-electromechanical system (MEMS) gyroscope that facilitates minimizing non-linearity effects of respective delays of C2V converters on an output of the MEMS gyroscope, with each bandpass sigma-delta ADC of the MEMS gyroscope including a C2V converter, an analog resonator, and a digital resonator, in accordance with various example embodiments.

Referring now to FIG. 6, a sense mass (104) of a sensor (102), e.g., a MEMS sensor, of the MEMS gyroscope generates a sense mass output that is based on an external stimulus that has been applied to the MEMS sensor. The sense mass output is electronically coupled to a first ADC input of a first bandpass sigma-delta ADC (604) that includes an SC2VC(106).

An output of the SC2VC is electrically coupled, via a pair of quantizers (including quantizer 610 and quantizer 618) using a first feedback loop (616), to the first ADC input to facilitate a reduction of a delay of the SC2VC corresponding to a first propagation delay of the first bandpass sigma-delta ADC.

Further, an output of a quantizer (618) of the pair of quantizers is electronically coupled to a first demodulator input of a demodulator (114)—an output of the demodulator representing an output signal ("OUTPUT") of the MEMS gyroscope.

A drive mass (124) of the MEMS sensor generates a drive mass output that is based on an internal stimulus that has been applied to the MEMS sensor. The drive mass output is electronically coupled to a second ADC input of a second bandpass sigma-delta ADC (624) that includes a DC2VC (126).

An output of the DC2VC is electrically coupled, via a pair of quantizers (including quantizer 630 and quantizer 638) using a second feedback loop (636), to the second ADC input to facilitate a reduction of a delay of the DC2VC corresponding to a second propagation delay of the second bandpass sigma-delta ADC.

Further, an output of a quantizer (638) of the pair of quantizers is electronically coupled, e.g., via a 90 degree phase shift (140), to a second demodulator input of the demodulator.

Figure 7:
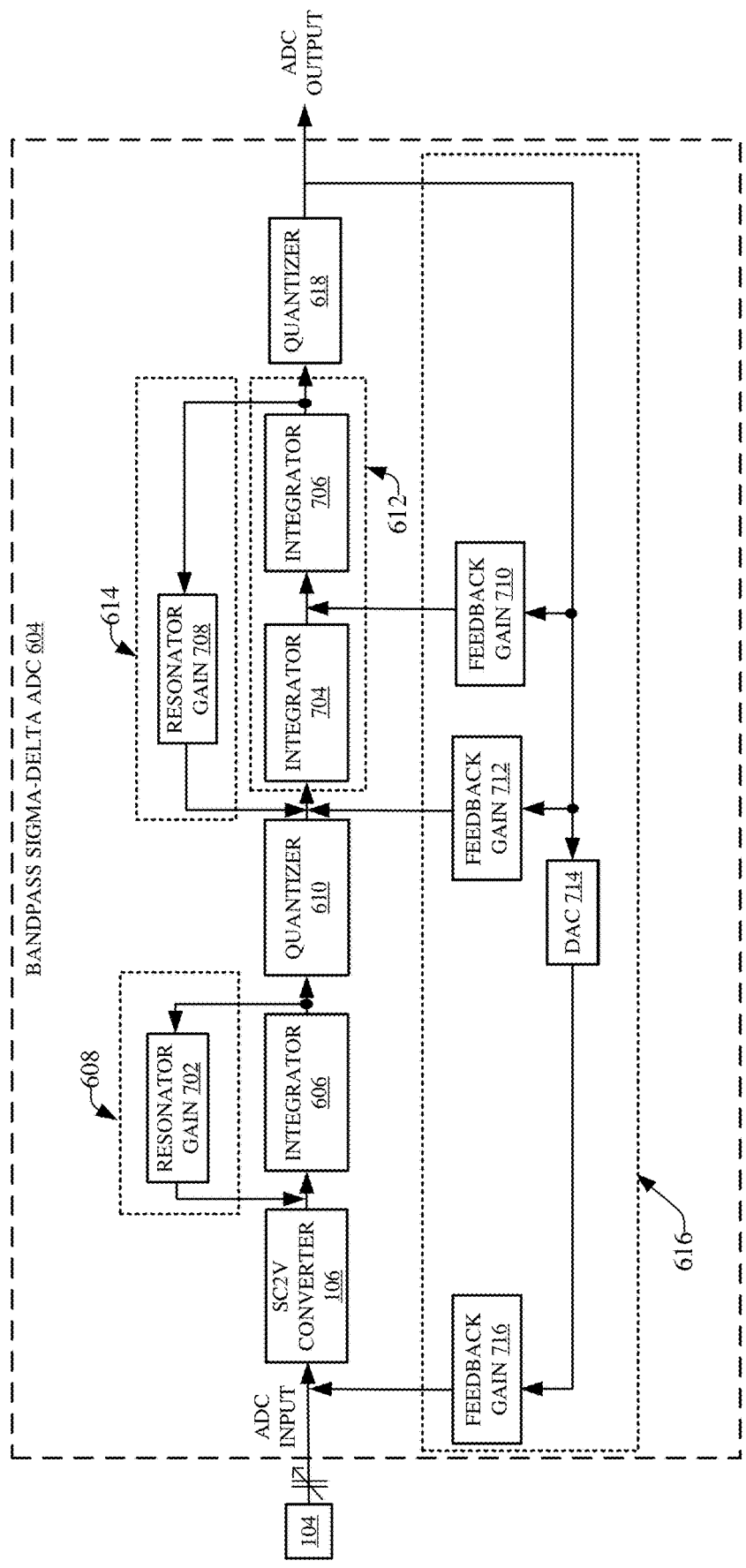
FIG. 7 illustrates a block diagram of a sense mass of a MEMS gyroscope electrically coupled to an input of a bandpass sigma-delta ADC of the MEMS gyroscope—the bandpass sigma-delta ADC including a C2V converter, an analog resonator, and a digital resonator, in accordance with various example embodiments.

Now referring to FIG. 7, the output of the SC2VC is electrically coupled to an analog resonator that includes an integrator (606) and analog resonator feedback (608) corresponding to an analog resonator gain (702) to facilitate an increase of a loop gain of the SC2VC at a resonant frequency of the analog resonator. In turn, an output of the analog resonator is electrically coupled, via a quantizer (610), e.g., SAR ADC, to a digital resonator that includes a pair of integrators (612) (including integrator 704 and integrator 706) and resonator feedback (614) corresponding to a digital resonator gain (708) to further facilitate the increase of the loop gain of the SC2VC.

In turn, a digital-to-analog converter (DAC) (714) of the first feedback loop (616) converts a digital value representing the output of the first ADC into an analog signal that is electronically coupled to an analog gain, or feedback gain (716), of the first feedback loop to facilitate modification of a feedback loop gain of the first feedback loop, e.g., to facilitate reducing the first propagation delay. In embodiment(s), digital gain(s) (710 and 712) can be utilized to modify the feedback loop gain of the first feedback loop.

Figure 8:
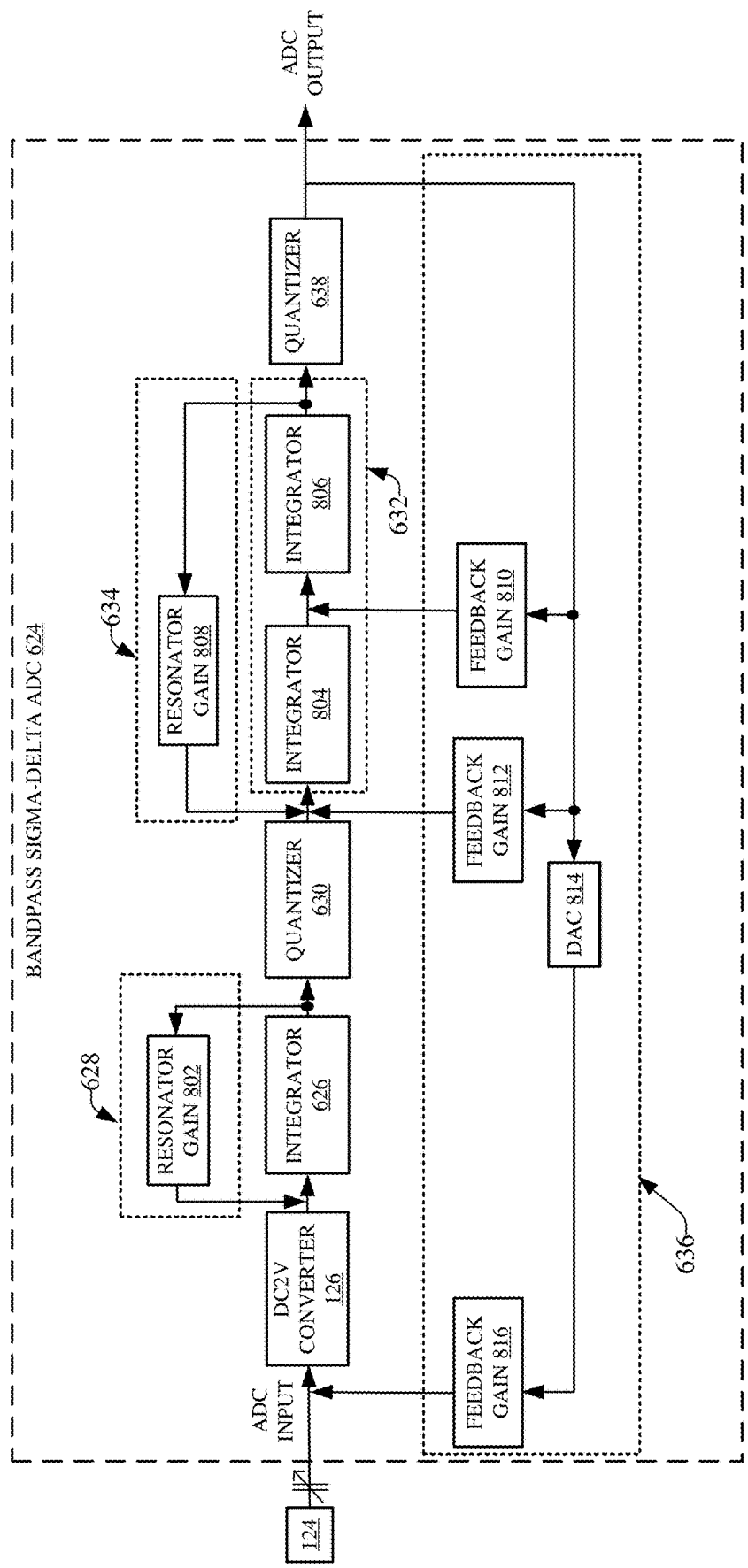
FIG. 8 illustrates a block diagram of a drive mass of a MEMS gyroscope electrically coupled to an input of a bandpass sigma-delta ADC of the MEMS gyroscope—the bandpass sigma-delta ADC including a C2V converter, an analog resonator, and a digital resonator, in accordance with various example embodiments.

As illustrated by FIG. 8, the output of the DC2VC is electrically coupled to an analog resonator that includes an integrator (626) and analog resonator feedback (628) corresponding to an analog resonator gain (802) to facilitate an increase of a loop gain of the DC2VC at a resonant frequency of the analog resonator. In turn, an output of the analog resonator is electrically coupled, via a quantizer (630), e.g., SAR ADC, to a digital resonator that includes a pair of integrators (632) (including integrator 804 and integrator 806) and resonator feedback (634) corresponding to a digital resonator gain (808) to further facilitate the increase of the loop gain of the DC2VC.

In turn, a DAC (814) of the second feedback loop (636) converts a digital value representing the output of the second ADC into an analog signal that is electronically coupled to an analog gain, or feedback gain (816), of the second feedback loop to facilitate modification of a feedback loop gain of the second feedback loop, e.g., to facilitate reducing the second propagation delay. In embodiment(s), digital gain(s) (810 and 812) can be utilized to modify the feedback loop gain of the first feedback loop.

Figure 9:
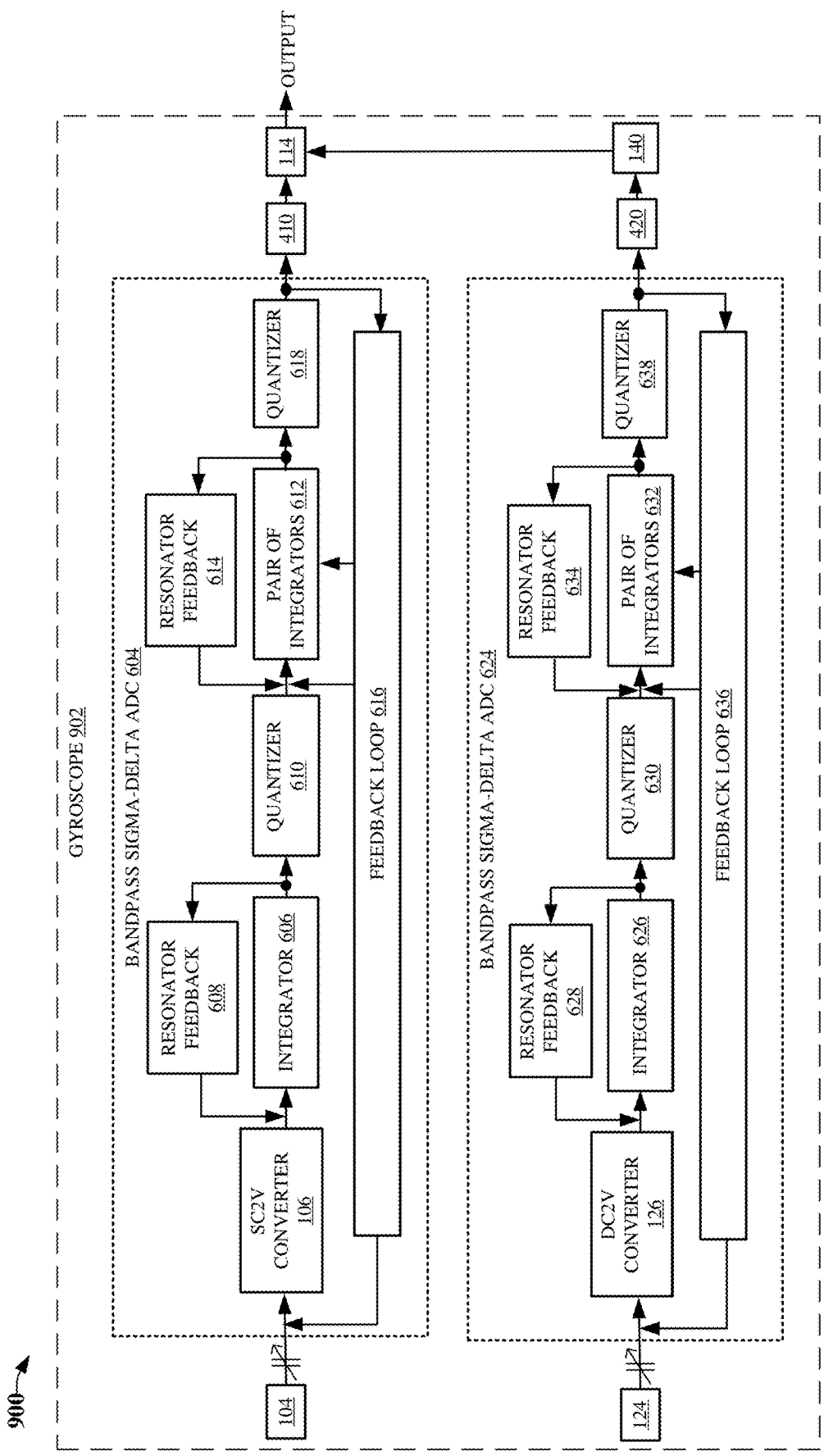
FIGS. 9-10 illustrate block diagrams of a MEMS gyroscope that facilitates minimizing non-linearity effects of a delay of a C2V converter on an output of the MEMS gyroscope—each bandpass sigma-delta ADC of the MEMS gyroscope including an analog resonator and a digital resonator, and the MEMS gyroscope including band pass filters at respective outputs of the bandpass sigma-delta ADCs, in accordance with various example embodiments.
Figure 10:
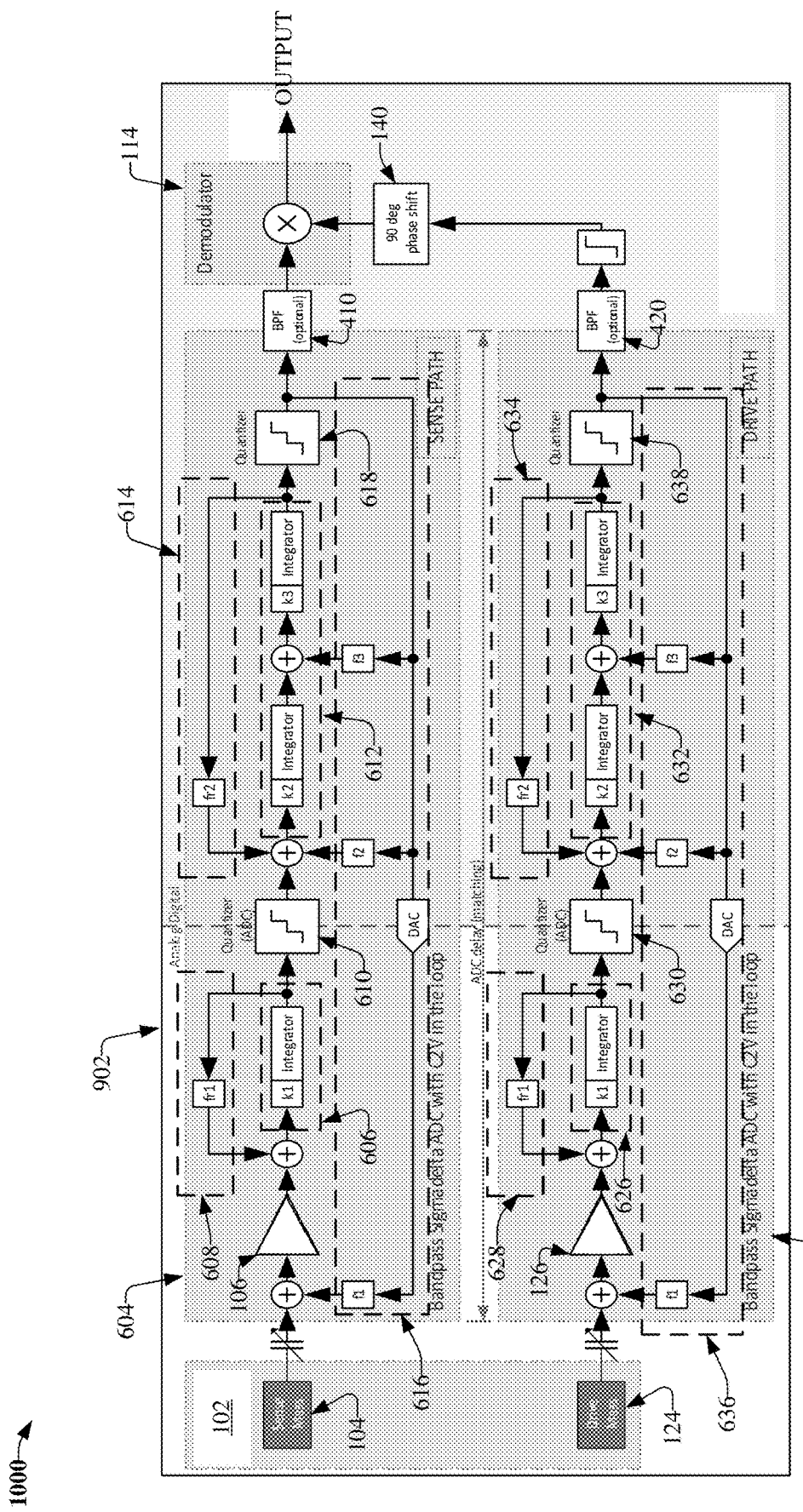

FIGS. 9-10 illustrate block diagrams of a MEMS gyroscope (902) including respective bandpass filters (410, 420) that facilitate reducing a defined amount of noise that is present on the first and second ADC outputs of respective bandpass sigma-delta ADCs (604, 624), e.g., corresponding to harmonics, noise, or other similar signals that are outside of a defined frequency band of interest of the OUTPUT signal—such signals not representing the external stimulus that has been applied to the MEMS sensor.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of systems, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A gyroscope, comprising:
   a sense mass that generates a sense mass output that is electronically coupled to a first analog-to-digital converter (ADC) input of a first bandpass sigma-delta ADC comprising a sense capacitance-to-voltage converter (SC2VC), wherein a first ADC output of the first bandpass sigma-delta ADC is electronically coupled, via a first feedback loop, to the first ADC input to facilitate a reduction of an SC2VC delay of the SC2VC corresponding to a first propagation delay of the first bandpass sigma-delta ADC, wherein the first ADC output is electronically coupled to a first demodulator input of a demodulator, and wherein a demodulator output of the demodulator represents an output signal of the gyroscope; and
   a drive mass that generates a drive mass output that is electronically coupled to a second ADC input of a second bandpass sigma-delta ADC comprising a drive capacitance-to-voltage converter (DC2VC), wherein a second ADC output of the second bandpass sigma-delta ADC is electronically coupled, via a second feedback loop, to the second ADC input to facilitate a reduction of a DC2VC delay of the DC2VC corresponding to a second propagation delay of the second bandpass sigma-delta ADC, and wherein the second ADC output is electronically coupled to a second demodulator input of the demodulator.

2. The gyroscope of claim 1, wherein the first bandpass sigma-delta ADC comprises a first pair of integrators, and wherein an SC2VC output of the SC2VC is electronically coupled to a first integrator input of a first integrator of the first pair of integrators.

3. The gyroscope of claim 2, wherein a first integrator output of the first integrator of the first pair of integrators is electronically coupled to a second integrator input of a second integrator of the first pair of integrators, and wherein a second integrator output of the second integrator of the first pair of integrators is electrically coupled to the SC2VC output.

4. The gyroscope of claim 3, wherein the second integrator output of the second integrator of the first pair of integrators is electrically coupled to a first quantizer that converts the second integrator output of the second integrator of the first pair of integrators into the first ADC output.

5. The gyroscope of claim 4, wherein the first ADC output is electronically coupled to the first demodulator input via a first bandpass filter.

6. The gyroscope of claim 3, wherein the second bandpass sigma-delta ADC comprises a second pair of integrators, and wherein a DC2VC output of the DC2VC is electronically coupled to a first integrator input of a first integrator of the second pair of integrators.

7. The gyroscope of claim 6, wherein a first integrator output of the first integrator of the second pair of integrators is electronically coupled to a second integrator input of a second integrator of the second pair of integrators, and wherein a second integrator output of the second integrator of the second pair of integrators is electrically coupled to the DC2VC output.

8. The gyroscope of claim 7, wherein the second integrator output of the second integrator of the second pair of integrators is electrically coupled to a second quantizer that converts the second integrator output of the second integrator of the second pair of integrators into the second ADC output.

9. The gyroscope of claim 8, wherein the second ADC output is electronically coupled to the second demodulator input via a second bandpass filter.

10. The gyroscope of claim 7, wherein at least one of the first propagation delay or the second propagation delay has been modified to facilitate a reduction of a difference between the first propagation delay and the second propagation delay.

11. The gyroscope of claim 10, wherein the first propagation delay has been modified via modification of a gain of a resonator corresponding to the first pair of integrators.

12. The gyroscope of claim 10, wherein the second propagation delay has been modified via modification of a gain of a resonator corresponding to the second pair of integrators.

13. A micro-electromechanical system (MEMS) gyroscope, comprising:
a MEMS sensor that generates
a first output signal that is based on an external stimulus that has been applied to the MEMS sensor, and
a second output signal that is based on an internal stimulus that has been applied to the MEMS sensor; and bandpass sigma-delta analog-to-digital converters comprising respective capacitance-to-voltage (C2V) amplifiers, wherein the first output signal that is based on the external stimulus is electrically coupled to a first analog-to-digital converter (ADC) input of a first bandpass sigma-delta ADC of the bandpass sigma-delta analog-to-digital converters, wherein the first bandpass sigma-delta ADC comprises a first C2V amplifier of the respective C2V amplifiers, wherein the second output signal that is based on the internal stimulus is electrically coupled to a second ADC input of a second bandpass sigma-delta ADC of the bandpass sigma-delta analog-to-digital converters, wherein the second bandpass sigma-delta ADC comprises a second C2V amplifier of the respective C2V amplifiers, wherein respective outputs of the bandpass sigma-delta ADC converters are electrically coupled, via respective feedback loops, to respective inputs of the first C2V amplifier and the second C2V amplifier to facilitate compressing respective propagation delays of the bandpass sigma-delta ADC converters, wherein respective outputs of the bandpass sigma-delta ADC converters are electronically coupled to a demodulator, and wherein an output of the demodulator transforms the first output signal of the MEMS sensor into a sense output of the MEMS gyroscope representing the external stimulus.

14. The MEMS gyroscope of claim 13, wherein a first amplifier output of the first C2V amplifier is electrically coupled to a first integrator input of a first integrator of a first pair of integrators of the first bandpass sigma-delta ADC, and wherein a second amplifier output of the second C2V amplifier is electrically coupled to a second integrator input of a second integrator of a second pair of integrators of the second bandpass sigma-delta ADC.

15. The MEMS gyroscope of claim 14, wherein the first bandpass sigma-delta ADC comprises a first resonator to facilitate an increase of a first loop gain of the first C2V amplifier at a first resonance frequency of the first resonator.

16. The MEMS gyroscope of claim 15, wherein the second bandpass sigma-delta ADC comprises a second resonator to facilitate an increase of a second loop gain of the second C2V amplifier at a second resonance frequency of the second resonator.

17. A micro-electromechanical system (MEMS) gyroscope, comprising:
a sense mass that generates a sense mass output that is electronically coupled to a first analog-to-digital converter (ADC) input of a first bandpass sigma-delta ADC comprising a sense capacitance-to-voltage converter (SC2VC), wherein an SC2VC output of the SC2VC is electrically coupled, via a first pair of quantizers using a first feedback loop, to the first ADC input to facilitate a reduction of an SC2VC delay of the SC2VC corresponding to a first propagation delay of the first bandpass sigma-delta ADC, wherein a first quantizer output of a first quantizer of the first pair of quantizers is electronically coupled to a first demodulator input of a demodulator, and wherein a demodulator output of the demodulator represents an output signal of the gyroscope; and
a drive mass that generates a drive mass output that is electronically coupled to a second ADC input of a second bandpass sigma-delta ADC comprising a drive capacitance-to-voltage converter (DC2VC), wherein a DC2VC output of the DC2VC is electrically coupled, via a second pair of quantizers using a second feedback loop, to the second ADC input to facilitate a reduction of a DC2VC delay of the DC2VC corresponding to a second propagation delay of the second bandpass sigma-delta ADC, wherein a second quantizer output of a second quantizer of the second pair of quantizers is electronically coupled to a second demodulator input of the demodulator.

18. The MEMS gyroscope of claim 17, wherein the SC2VC output is electrically coupled to a first analog resonator to facilitate an increase of a first loop gain of the SC2VC at a first resonant frequency of the first analog resonator, and wherein the DC2VC output is electrically coupled to a second analog resonator to facilitate an increase of a second loop gain of the DC2VC at a second resonant frequency of the second analog resonator.

19. The MEMS gyroscope of claim 18, wherein a first resonator output of the first analog resonator is electrically coupled, via a second quantizer of the first pair of quantizers, to a first digital resonator to further facilitate the increase of the first loop gain of the SC2VC, and wherein a second resonator output of the second analog resonator is electrically coupled, via a second quantizer of the second pair of quantizers, to a second digital resonator to further facilitate the increase of the second loop gain of the DC2VC.

* * * * *